United States Patent [19]

Manning

[11] Patent Number: 5,877,051
[45] Date of Patent: Mar. 2, 1999

[54] METHODS OF REDUCING ALPHA PARTICLE INFLICTED DAMAGE TO SRAM CELLS, METHODS OF FORMING INTEGRATED CIRCUITRY, AND METHODS OF FORMING SRAM CELLS

[75] Inventor: H. Montgomery Manning, Kuna, Id.

[73] Assignee: Micron Technology, Inc., Boise, Id.

[21] Appl. No.: 917,450

[22] Filed: Aug. 22, 1997

[51] Int. Cl.⁶ .................................................. H01L 21/8234
[52] U.S. Cl. ........................ 438/238; 438/241; 438/152; 438/153; 438/953; 257/903; 257/904
[58] Field of Search .................................... 438/152, 153, 438/953, 238, 241; 257/903, 904

[56] References Cited

U.S. PATENT DOCUMENTS

| | | |
|---|---|---|
| 4,442,591 | 4/1984 | Haken . |
| 4,546,535 | 10/1985 | Shepard . |
| 4,613,885 | 9/1986 | Haken . |
| 4,635,085 | 1/1987 | Taguchi . |
| 4,702,796 | 10/1987 | Nakajlano et al. . |
| 4,702,797 | 10/1987 | Shimano et al. ........................ 438/953 |
| 4,728,629 | 3/1988 | Pflester et al. . |
| 4,735,915 | 4/1988 | Kita et al. . |
| 4,864,382 | 9/1989 | Aoki et al. . |
| 5,057,893 | 10/1991 | Sheng et al. .............................. 357/41 |
| 5,102,811 | 4/1992 | Scott . |
| 5,108,945 | 4/1992 | Matthews ................................ 438/238 |
| 5,109,258 | 4/1992 | Redwine . |
| 5,122,846 | 6/1992 | Haken .................................... 357/23.4 |
| 5,168,335 | 12/1992 | D'Arrigo et al. . |
| 5,173,438 | 12/1992 | Sandhu . |
| 5,240,874 | 8/1993 | Roberts . |
| 5,384,476 | 1/1995 | Nishizawa et al. . |
| 5,405,788 | 4/1995 | Manning et al. . |
| 5,453,640 | 9/1995 | Kinoshita ................................ 257/520 |
| 5,489,546 | 2/1996 | Ahmad et al. .......................... 438/241 |
| 5,501,993 | 3/1996 | Borland .................................. 437/34 |
| 5,552,623 | 9/1996 | Nishizawa et al. . |
| 5,592,011 | 1/1997 | Yang ....................................... 257/368 |
| 5,620,922 | 4/1997 | Yoshida et al. .......................... 438/210 |
| 5,631,187 | 5/1997 | Phipps et al. ............................ 438/237 |
| 5,693,975 | 12/1997 | Lien ........................................ 257/374 |
| 5,705,437 | 1/1998 | Wu et al. ................................ 438/238 |
| 5,770,497 | 6/1998 | Wu et al. ................................ 438/238 |
| 5,798,551 | 8/1998 | Kikushima et al. ..................... 257/368 |

FOREIGN PATENT DOCUMENTS 56-87340  7/1991  Japan .

OTHER PUBLICATIONS

Stanley Wolf, Ph.D., Silicon Processing for the VLSI Era, vol. 2: Process Integration, pp. 23–25, 333, 428–431, 691–693.

*Primary Examiner*—John F. Niebling
*Assistant Examiner*—Lynne A. Gurley
*Attorney, Agent, or Firm*—Wells, St. John, Roberts, Gregory & Matkin, P.S.

[57] ABSTRACT

The present invention pertains to methods of forming integrated circuitry, methods of forming SRAM cells, and methods of reducing alpha particle inflicted damage to SRAM cells. Additionally, the present invention pertains to integrated circuitry. In one aspect, the invention includes a method which includes: a) forming at least one second conductivity type diffusion region beneath at least one of an SRAM cell pull-down device drain of a first conductivity type and an SRAM cell access device source of the first conductivity type; and b) not forming a second conductivity type diffusion region beneath at least one of a source of the SRAM cell pull-down device and a drain of the SRAM cell access device. In another aspect, the invention includes a method which includes a) providing a semiconductor substrate; b) defining an SRAM cell pull-down device region of the semiconductor substrate, the pull-down device region having a pull-down device source region and a pull-down device drain region; c) defining an SRAM access device source region and an access device drain region; d) defining a field oxide isolation region of the semiconductor substrate; and e) in a common implant, implanting a conductivity-enhancing dopant of a first conductivity type beneath the field oxide region, beneath the access device source region, and beneath the pull-down device drain region; the common implant not implanting the conductivity-enhancing dopant of the first conductivity type beneath at least one of the access device drain region and the pull-down device source region.

22 Claims, 2 Drawing Sheets

5,877,051

METHODS OF REDUCING ALPHA PARTICLE INFLICTED DAMAGE TO SRAM CELLS, METHODS OF FORMING INTEGRATED CIRCUITRY, AND METHODS OF FORMING SRAM CELLS

TECHNICAL FIELD

The present invention pertains to methods of forming integrated circuitry, methods of forming SRAM cells, and methods of reducing alpha particle inflicted damage to SRAM cells. Additionally, the present invention pertains to integrated circuitry.

BACKGROUND OF THE INVENTION

FIG. 1 shows a prior art static random access memory (SRAM) cell 10. Memory cell 10 comprises n-channel pull-down (drive) transistors 12 and 14 having drains respectively connected to pull-up load elements or resistors 16 and 18. Transistors 12 and 14 are typically metal oxide silicon field effect transistors (MOSFETs) formed proximate an underlying silicon semiconductor substrate.

The source regions of transistors 12 and 14 are tied to a low reference or circuit supply voltage, labeled $V_{SS}$ and typically referred to as "ground." Resistors 16 and 18 are respectively connected in series between a high reference or circuit supply voltage, labeled $V_{CC}$, and the drains of transistors 12 and 14, respectively. The drain of transistor 14 is connected to the gate of transistor 12 by a line 20, and the drain of transistor 12 is connected to the gate of transistor 14 by a line 22 to form a flip-flop having a pair of complementary two-state outputs.

A memory flip-flop, such as that described above in connection with FIG. 1, typically forms one memory element of an integrated array of static memory elements. A plurality of access transistors, such as access transistors 24 and 26, are used to selectively address and access individual memory elements within the array. Access transistor 24 has one active terminal connected to the drain of transistor 12. Access transistor 26 has one active terminal connected to the drain of transistor 14. A plurality of complementary column line pairs, such as the single shown pair of complementary column lines 28 and 30, are connected to the remaining active terminals of access transistors 24 and 26. A row line 32 is connected to the gates of access transistors 24 and 26.

Reading static memory cell 10 involves activating row line 32 to connect outputs 34 and 36 to column lines 28 and 30. Writing to static memory cell 10 involves first placing selected complementary logic voltages on column lines 28 and 30, and then activating row line 32 to connect those logic voltages to outputs 34 and 36. This forces the outputs to the selected logic voltages, which will be maintained as long as power is supplied to the memory cell, or until the memory cell is reprogrammed.

A static memory cell is said to be bi-stable because it has two stable or self-maintaining operating states, corresponding to two different output voltages. Without external stimuli, a static memory cell will operate continuously in a single one of its two operating states. It has internal feedback to maintain a stable output voltage, corresponding to the operating state of the memory cell, as long as the memory cell receives power.

The two possible output voltages produced by a static memory cell correspond generally to upper and lower circuit supply voltages. Intermediate output voltages, between the upper and lower circuit supply voltages, generally do not occur except during brief periods of memory cell power-up and during transitions from one operating state to the other operating state.

FIG. 2 illustrates a fragmentary cross-sectional view of a prior art layout of portions of the FIG. 1 SRAM schematic pertinent to this disclosure. Referring to FIG. 2, a semiconductor wafer substrate 40 is illustrated. Pull-down transistor device 12 and access device transistor 24 are formed proximate substrate 40. Transistor devices 12 and 24 comprise gates 42 and 44, respectively. Sidewall spacers 46 are formed adjacent gates 42 and 44. Transistor device 12 comprises a source 50 and a drain 52. Source 50 is in electrical connection with $V_{SS}$ and drain 52 is in electrical connection with resistor 16. Further, drain 52 comprises a common diffusion region which is also a source for access transistor device 24. Access device 24 further comprises a drain 54 which is in electrical connection with column line 28. Transistor devices 12 and 24 are commonly n-type MOSFETs (i.e., NMOS transistors). Accordingly, semiconductor substrate 40 generally comprises a background p-type doping. A typical background dopant concentration is from about $10^{15}$ to about $10^{18}$ atoms/cm$^3$. Source/drain regions 50, 52 and 54 are formed of n-type conductivity-enhancing dopant provided to a concentration which overwhelms the background p-type doping. A typical source/drain dopant concentration is from about $10^{19}$ to about $10^{21}$ atoms/cm$^3$.

Also shown in FIG. 2 is an n-type collector region 60 formed beneath devices 12 and 24. N-type collector region is preferably kept at a potential of about 3.3 volts and functions to collect spurious electrons generated by, for example, alpha particle hits into substrate 40. N-type collector region 60 typically comprises an n-type dopant concentration of about $10^{17}$ atoms/cm$^3$ which is implanted to a depth of from about 1 to about 4 microns beneath an upper surface of wafer substrate 40.

Alpha particles are naturally occurring ionizing radiation which can penetrate into a silicon substrate and generate electron-hole pairs. One source of alpha particles is the decay of radioactive impurities such as uranium or thorium, known to be present in trace levels in common semiconductor packaging materials. The alpha particles can generate sufficient charge adjacent an SRAM memory cell node to upset the data state of the SRAM memory cell. Such events are termed "soft errors." Soft error rates must be controlled to very low levels for reliable operation of semiconductor devices. The shown n-type collector region 60 is a prior art method of reducing soft error rate. Specifically, electrons generated by alpha particles are attracted to collector region 60 and trapped therein. However, a difficulty can occur if the electrons are generated closer to source/drain region 52 than to collector region 60 in that the electrons will frequently be attracted preferentially to source/drain region 52 and thereby potentially cause a soft error rate in an SRAM memory cell device.

It would be desirable to develop alternative methods of protecting SRAM devices and integrated circuitry from alpha particle hits. Preferably, such alternative methods would better protect a drain region of a pull-down transistor, or a source region of an access device transistor, than does the n-type collector region discussed above in describing the prior art. Also, it would be desirable to develop methods for protecting devices from alpha particle inflicted damage which do not require n-type collector regions. Such methods would advantageously eliminate the processing steps required to form n-type collector regions.

SUMMARY OF THE INVENTION

The present invention pertains to methods of forming integrated circuitry, methods of forming SRAM cells, and methods of reducing alpha particle inflicted damage to SRAM cells. Additionally, the present invention pertains to integrated circuitry. In one aspect, the invention encompasses a method of reducing alpha particle inflicted damage to an SRAM cell. At least one second conductivity type diffusion region is formed beneath at least one of an SRAM cell pull-down device drain of a first conductivity type and an SRAM cell access device source of the first conductivity type. Also, a second conductivity type diffusion region is not formed beneath at least one of a source of the SRAM cell pull-down device and a drain of the SRAM cell access device.

In another aspect, the invention encompasses a method of forming integrated circuitry. A semiconductor substrate is provided. An SRAM cell pull-down device region of the semiconductor substrate is defined. The pull-down device region comprises a pull-down device source region and a pull-down device drain region. An SRAM cell access device region of the semiconductor substrate is defined. The access device region comprises an access device source region and an access device drain region. A field oxide isolation region of the semiconductor substrate is defined. In a common implant, a conductivity-enhancing dopant of a first conductivity type is implanted beneath the field oxide region, beneath the access device source region, and beneath the pull-down device drain region. The conductivity-enhancing dopant of the first conductivity type is not implanted beneath at least one of the access device drain region and the pull-down device source region during the common implant.

In another aspect, the invention encompasses an integrated circuit. The integrated circuit comprises an SRAM cell pull-down device having a pull-down device source and a pull-down device drain, the pull-down device source and drain being of a first conductivity type. The integrated circuit further comprises an SRAM cell access device having an access device source and an access device drain, the access device source and drain being of the first conductivity type. Additionally, the integrated circuit comprises at least one second conductivity type diffusion region beneath at least one of the SRAM cell pull-down device drain and the SRAM cell access device source. Further, the integrated circuit comprises no second conductivity type diffusion region within at least one of a first open region extending 4000 angstroms directly beneath the SRAM cell pull-down device source and a second open region extending 4000 angstroms directly beneath the SRAM cell access device drain.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
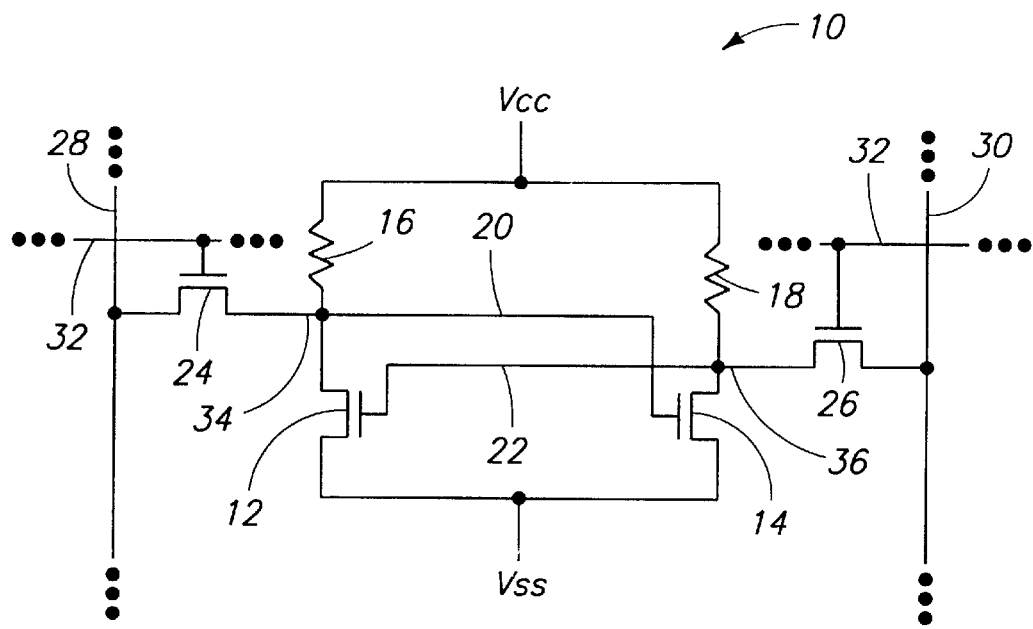
FIG. 1 is a schematic of a prior art SRAM cell.
Figure 2:
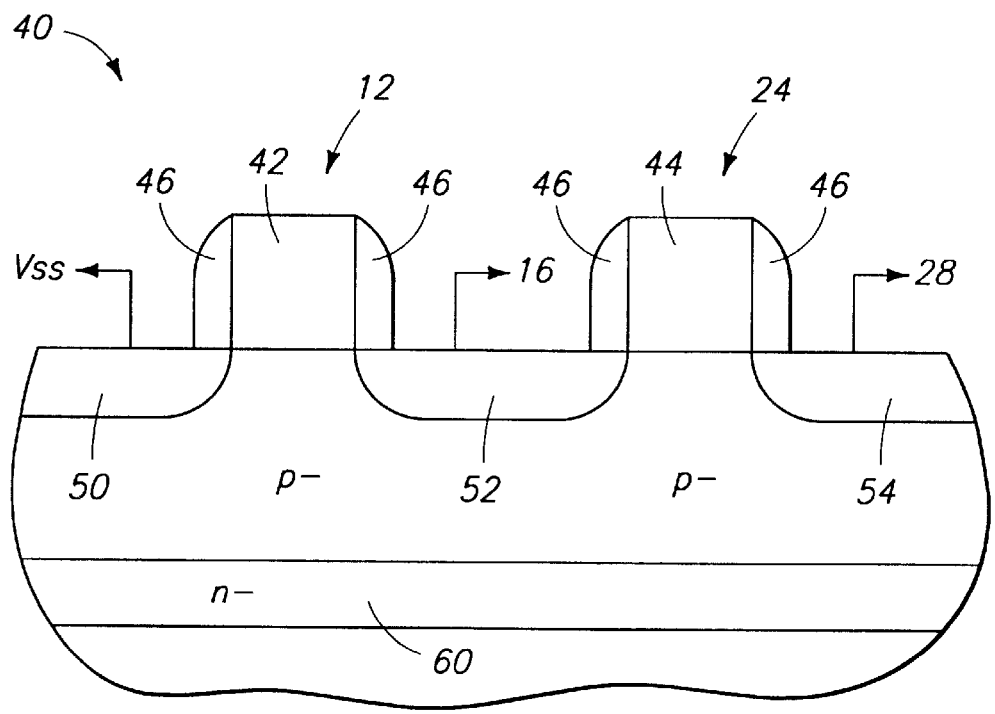
FIG. 2 is a diagrammatic cross-sectional fragmentary view of a portion of the prior art SRAM cell of FIG. 1.
Figure 3:
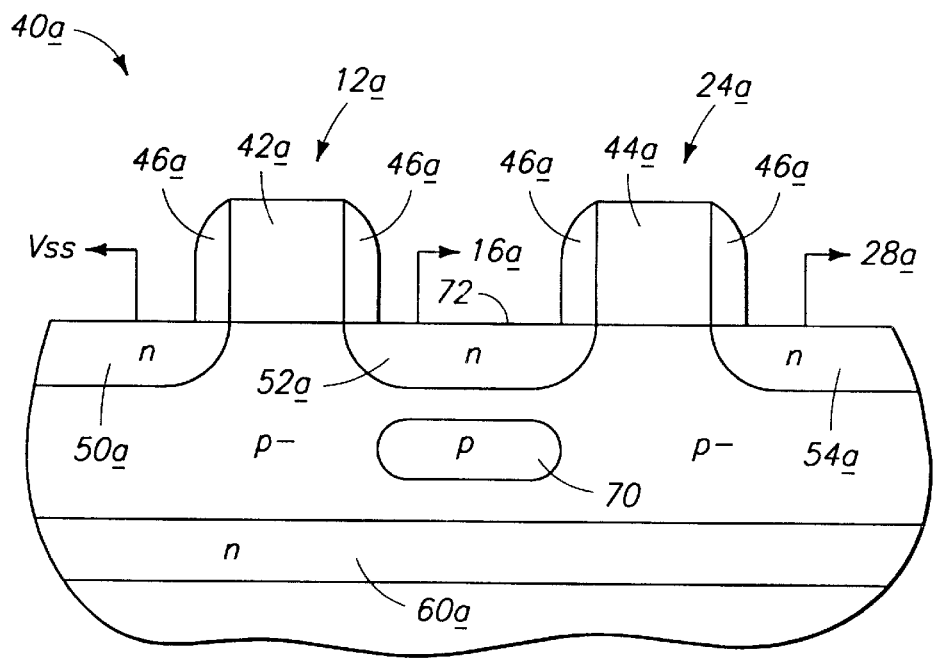
FIG. 3 is a diagrammatic cross-sectional fragmentary view of a portion of an SRAM cell produced in accordance with the present invention.

A portion of an SRAM cell produced in accordance with the present invention is described with reference to FIG. 3. In describing FIG. 3, similar numerals to those utilized above in describing the prior art are used, with differences indicated by the suffix "a" or with different numerals. A pull-down transistor device 12a and an access transistor device 24a are formed proximate a semiconductor substrate 40a. Transistor devices 12a and 24a comprise transistor gates 42a and 44a, respectively. Source/drain regions 50a, 52a and 54a are formed operatively proximate transistor gates 42a and 44a. Source/drain region 52a comprises a drain of pull-down device 12a and a source of access device 24a. It is noted that, although the source of transistor device 12a and drain of access device 24a are illustrated as a common diffusion region 52a, the source and drain could also be separate regions electrically connected to one another.

In the shown embodiment, transistor devices 12a and 24a are NMOS devices, with source/drain regions 50a, 52a and 54a being n-type diffusion regions. In alternative embodiments of the invention which are not shown, transistor devices 12a and 24a can be PMOS devices, with source/drain regions 50a, 52a and 54a then comprising p-type diffusion regions. If devices 12a and 24a are p-type devices, the background doping proximate the devices would typically be n-minus rather than the illustrated p-minus. Such distinction between PMOS devices and NMOS devices is well known to persons of ordinary skill in the art.

An n-type collector region 60a is shown formed beneath transistor devices 12a and 24a. N-type collector region 60a is optional in applications of the present invention as the invention provides an alternate method of protecting devices from alpha particle inflicted damage. In applications in which n-type collector region 60a is eliminated, the present invention advantageously eliminates processing steps required for formation of n-type collector region 60a.

A p-type diffusion region 70 is formed beneath common source/drain region 52a. P-type diffusion region 70 does not extend beneath source region 50a of pull-down device 12a or beneath drain region 54a of access device 24a. P-type diffusion region 70 can function to divert spurious electrons, such as those generated by alpha particle radiation, around common diffusion region 52a and toward diffusion regions 50a and 54a. Soft errors occur if spurious electrons penetrate into common diffusion region 52a, but not if the electrons are directed into either region 50a or 54a. Thus, the present invention directs spurious electrons around diffusion region 52a and toward regions 50a and 54a.

In applying the invention to PMOS devices, the conductivity type dopant of region 70 would be an n-type dopant, rather than the p-type dopant shown. In any event, the conductivity type of region 70 is preferably opposite to the conductivity type of source/drain region 52a.

Diffusion region 70 is defined to have a higher dopant concentration than any background doping of substrate 40a. Preferably the background doping will be provided to a concentration of from about $10^{15}$ to about $10^{18}$ atoms/cm$^3$, and the dopant concentration within diffusion region 70 will be provided to a concentration of from about $5\times10^{17}$ to about $5\times10^{18}$ atoms/cm$^3$. More preferably, the dopant concentration within diffusion region 70 will be provided to a concentration of from about $5\times10^{17}$ to about $8\times10^{17}$ atoms/cm$^3$.

Substrate 40a has a surface 72, and diffusion region 70 will preferably have a peak implant depth of from about 3500 angstroms to about 5000 angstroms beneath surface 72. Most preferably such peak implant depth will be from about 3500 angstroms to about 4000 angstroms beneath surface 72. Diffusion region 70 may be provided by, for example, implanting a conductivity-enhancing dopant at a dose of about $5 \times 10^{12}$ atoms/cm$^2$ and an energy of 150 keV.

In preferred aspects of the present invention, diffusion region 70 will be within about 5000 angstroms beneath source/drain region 52a. Also, in such preferred aspects no diffusion region having a conductivity-type of diffusion region 70 will be within a first open region extending 5000 angstroms directly beneath pull-down device source 50a. Further, no diffusion region having a conductivity-type of diffusion region 70 will be within a second open region extending 5000 angstroms directly beneath access device drain 54a. In more preferred aspects of the present invention, diffusion region 70 will be within about 4000 angstroms beneath source/drain region 52a. Also, in such more preferred aspects no diffusion region having a conductivity-type of diffusion region 70 will be within a first open region extending 4000 angstroms directly beneath pull-down device source 50a and a second open region extending 4000 angstroms directly beneath access device drain 54a. The first and second open regions are kept clear of diffusion regions having a conductivity type of region 70 to provide clear paths for spurious electrons (or holes) to travel around region 70 and to region 50a or 54a.

In applications in which a source of access device 24a is not a common diffusion region with a drain of pull-down device 12a, diffusion region 70 in accordance with an aspect of the invention is formed under at least one of the pull-down device drain or the access device source. Preferably, diffusion region 70 will extend to beneath both the separated pull-down device drain and the access device source in such instance. In alternative embodiments of the invention, a plurality of diffusion regions 70 may be utilized with a first diffusion region under a pull-down device drain and a separate second diffusion region under an access device source.

Figure 4:
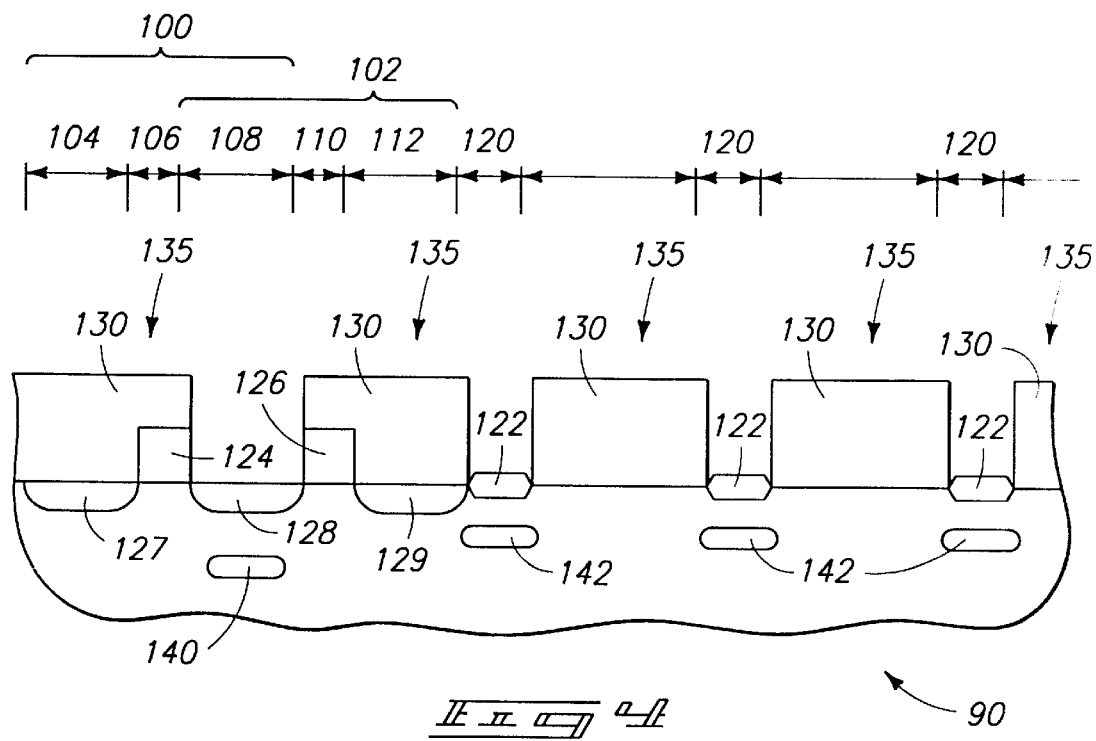
FIG. 4 is a diagrammatic cross-sectional fragmentary view of a portion of a wafer produced according to the present invention, showing a more extended region of the wafer than that shown in FIG. 3.

A preferred method of forming diffusion region 70 encompasses forming the region in conjunction with a local implanted field (LIF). Such preferred method is described with reference to FIG. 4. FIG. 4 illustrates a semiconductive substrate wafer 90 which can comprise, for example, silicon. Semiconductor substrate 90 will preferably be background doped with a p-type conductivity-enhancing dopant to a concentration of from about $10^{15}$ to about $10^{18}$ atoms/cm$^3$. Semiconductor substrate 90 may further comprise wells of n-type background dopant for formation of PMOS devices, as is known to persons of ordinary skill in the art.

Proximate a surface of substrate 90 is defined an SRAM pull-down device region 100, an SRAM access transistor device region 102, and one or more field-oxide isolation regions 120. Pull-down device region 100 further comprises a pull-down device source region 104, a pull-down device gate region 106 and a pull-down device drain region 108. Access device region 102 comprises an access device source region which overlays pull-down device drain region 108. Additionally, access device region 102 comprises an access device gate region 110 and an access device drain region 112.

Field-oxide 122 (synonymous herein with any field isolation oxide no matter how found) is ultimately formed within field-oxide isolation regions 120. Transistor gates 124 and 126 are ultimately formed in transistor gate regions 106 and 110, respectively. Transistor gates 124 and 126 may be formed by conventional methods. Source/drain diffusion regions 127, 128 and 129 are ultimately formed in source/drain regions 104, 108 and 112, respectively. Source/drain diffusion regions 127, 128 and 129 may be formed by conventional methods, such as, for example, implanting.

A masking layer 130 is provided over substrate 90 to cover pull-down device source region 104 and access device drain region 112, while leaving regions 108 and 120 exposed. Masking layer 130 also covers gate regions 106 and 110. After providing masking layer 130, a dopant 135 is implanted into substrate 90 to form a diffusion region 140 beneath source/drain region 108 and to form LIF implant regions 142 beneath field-oxide isolation regions 120. LIF implant regions, such as regions 142, are known in the art to enhance isolation of adjacent devices separated by a field-oxide. Diffusion region 140 functions analogously to the diffusion region 70 discussed above with reference to FIG. 3.

The type of dopant 135 is chosen to be opposite to the type of dopant ultimately utilized in source/drain regions 127, 128 and 129. Thus, if source/drain regions 127, 128 and 129 are to comprise a first-type conductivity-enhancing dopant, diffusion regions 140 and 142 will comprise a second-type conductivity-enhancing dopant which is opposite in conductivity-enhancing type to the first-type dopant. Accordingly, if source/drain regions 127, 128 and 129 comprise n-type conductivity-enhancing dopant, diffusion regions 140 and 142 will comprise p-type conductivity-enhancing dopant. Also, if diffusion regions 127, 128 and 129 comprise p-type conductivity-enhancing dopant, diffusion regions 140 and 142 will comprise n-type conductivity-enhancing dopant.

LIF regions 142 are commonly formed in semiconductor processing applications. Thus, the use of the LIF masking step to form diffusion regions 140 advantageously permits diffusion regions 140 to be incorporated into semiconductor devices without adding additional masking steps to common semiconductor processing applications.

Although the shown embodiment has gates 124 and 126, as well as diffusion regions 127, 128 and 129, formed before implant of dopant 135, the invention encompasses other embodiments in which the order is reversed. Also, the invention encompasses embodiments in which field-oxides 122 are formed after implanting dopant 135, rather than the shown formation before implanting dopant 135. However, it is preferred that field-oxides 122 be formed before implant of dopant 135 so that the diffusion regions 142 are formed less deep than the diffusion region 140.

Although the invention has been described in application to SRAM devices, it is to be understood that the invention may have application to other structures and devices. The invention should have particular utility for integrated circuits comprising transistor devices.

To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of reducing alpha particle inflicted damage to an SRAM cell comprising:
   forming at least one second conductivity type diffusion region beneath at least one of an SRAM cell pull-down device drain of a first conductivity type and an SRAM cell access device source of the first conductivity type; and
   not forming a second conductivity type diffusion region beneath at least one of a source of the SRAM cell pull-down device and a drain of the SRAM cell access device, wherein the at least one second conductivity type diffusion region is also formed beneath a field oxide and, wherein the first conductivity type is an opposite conductivity type from the second conductivity type.

2. The method of claim 1 wherein the first conductivity type is p-type and the second conductivity type is n-type.

3. The method of claim 1 wherein the first conductivity type is n-type and the second conductivity type is p-type.

4. The method of claim 1 wherein the access device source and the pull-down device drain are electrically connected with one another.

5. The method of claim 1 wherein the access device source and the pull-down device drain comprise a common diffusion region.

6. A method of forming integrated circuitry comprising:
   providing a semiconductor substrate;
   defining an SRAM cell pull-down device region of the semiconductor substrate, the pull-down device region comprising a pull-down device source region and a pull-down device drain region wherein the source and drain regions of the pull-down device are of a second conductivity type;
   defining an SRAM cell access device region of the semiconductor substrate, the access device region comprising an access device source region and an access device drain region wherein the source and drain regions of the access device are of the second conductivity type;
   defining a field oxide isolation region of the semiconductor substrate; and
   in a common implant, implanting a conductivity-enhancing dopant of a first conductivity type beneath the field oxide region, beneath the access device source region, and beneath the pull-down device drain region; the common implant not implanting the conductivity-enhancing dopant of the first conductivity type beneath at least one of the access device drain region and the pull-down device source region wherein the first conductivity type is an opposite conductivity type from the second conductivity type.

7. The method of claim 6 further comprising electrically connecting the pull-down device drain region with the access device source region.

8. The method of claim 6 further comprising, after the common implant:
   implanting a conductivity-enhancing dopant of a second conductivity type into the pull-down device source and drain regions; and
   implanting a conductivity-enhancing dopant of the second conductivity type into the access device source and drain regions.

9. The method of claim 8 wherein the first conductivity type is p-type and the second conductivity type is n-type.

10. The method of claim 8 wherein the first conductivity type is n-type and the second conductivity type is p-type.

11. The method of claim 6 further comprising, before the common implant:
    implanting a conductivity-enhancing dopant of a second conductivity type into the pull-down device source and drain regions; and
    implanting a conductivity-enhancing dopant of the second conductivity type into the access device source and drain regions.

12. The method of claim 11 wherein the first conductivity type is p-type and the second conductivity type is n-type.

13. The method of claim 11 wherein the first conductivity type is n-type and the second conductivity type is p-type.

14. The method of claim 6 wherein conductivity-enhancing dopant of the common implant is not implanted beneath either the access device drain region or the pull-down device source region.

15. The method of claim 6 wherein the access device drain region and the pull-down device source region are both masked during the common implant.

16. The method of claim 6 wherein the access device has an access device gate region, wherein the pull-down device has a pull-down device gate region, and wherein the access device drain region, pull-down device source region, access device gate region and pull-down device gate region are masked during the common implant.

17. A method of forming an SRAM cell comprising:
    providing a semiconductor substrate;
    forming a pull-down device proximate the semiconductor substrate, the pull-down device having a pull-down device source and a pull-down device drain, the pull-down device source and drain comprising a conductivity-enhancing dopant of a first conductivity type;
    forming an access device proximate the semiconductor substrate, the access device having an access device source and an access device drain, the access device source and drain comprising a conductivity-enhancing dopant of the first conductivity type, the access device source being electrically connected to the pull-down device drain;
    forming a field oxide proximate the semiconductor substrate; and
    in a common implant, implanting a conductivity-enhancing dopant of a second conductivity type beneath the field oxide, beneath the access device source, and beneath the pull-down device drain; the common implant not implanting the conductivity-enhancing dopant of the second conductivity type beneath the access device drain and not implanting the conductivity-enhancing dopant of the second conductivity type beneath the pull-down device source wherein the first conductivity type is an opposite conductivity type from the second conductivity type.

18. The method of claim 17 wherein the first conductivity type is p-type and the second conductivity type is n-type.

19. The method of claim 17 wherein the first conductivity type is n-type and the second conductivity type is p-type.

20. The method of claim 17 wherein the access device source and the pull-down device drain comprise a common deffusion region.

21. The method of claim 17 further comprising forming a bitline in electrical coonnection with the access device drain.

22. The method of claim 17 further comprising forming a $V_{SS}$ line in electrical connection with the pull-down device source.

* * * * *

UNITED STATES PATENT AND TRADEMARK OFFICE
CERTIFICATE OF CORRECTION

PATENT NO. : 5,877,051

DATED : March 2, 1999

INVENTOR(S) : H. Montgomery Manning

It is certified that error appears in the above-identified patent and that said Letters Patent is hereby corrected as shown below:

Col. 8, l. 60: Replace "deffusion" with --diffusion--.

Signed and Sealed this

Twenty-fifth Day of January, 2000

Attest:

Attesting Officer

*Acting Commissioner of Patents and Trademarks*